United States Patent [19]
Lumbard

[11] Patent Number: 5,991,160
[45] Date of Patent: Nov. 23, 1999

[54] SURFACE MOUNT LED ALPHANUMERIC DISPLAY

[75] Inventor: Marvin Lumbard, Los Gatos, Calif.

[73] Assignee: Infineon Technologies Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/579,538

[22] Filed: Dec. 27, 1995

[51] Int. Cl.⁶ ............................. H05K 7/02; H01L 23/28
[52] U.S. Cl. ........................... 361/760; 174/52.4; 257/99; 257/100; 257/787; 361/820
[58] Field of Search .................... 174/52.1–52.4; 257/80–84, 88, 91, 59, 92, 93, 95, 99, 100, 290, 433, 466, 676, 434, 910, 911, 918, 723, 787; 361/760, 782, 783, 805, 806, 820; 439/68; 438/107, 112, 116, 125, 126, 127

[56] References Cited

U.S. PATENT DOCUMENTS

| 4,724,472 | 2/1988 | Sugimoto et al. | 257/723 |
| 4,843,036 | 6/1989 | Schmidt et al. | 438/127 |
| 5,313,365 | 5/1994 | Pennisi et al. | 361/760 |
| 5,463,229 | 10/1995 | Takase et al. | 257/59 |
| 5,682,066 | 10/1997 | Gamota et al. | 257/787 |

FOREIGN PATENT DOCUMENTS

| 4237107 | 5/1994 | Germany. | |
| 63-181439 | 7/1988 | Japan. | |
| 1-297870 | 11/1989 | Japan | 257/100 |
| 08070200 | 3/1996 | Japan. | |
| WO97/24770 | 10/1997 | WIPO | 361/760 |

Primary Examiner—Donald Sparks

[57] ABSTRACT

The heat tolerance of an LED alphanumeric display device having a clear epoxy encapsulation can be improved by matching the coefficient of thermal expansion (CTE) of the inner circuit board to the high CTE of the epoxy. When heat is applied to fix the device to a circuit board, the components will expand at a nearly equal rate, avoiding cracking and failure.

11 Claims, 2 Drawing Sheets

SURFACE MOUNT LED ALPHANUMERIC DISPLAY

FIELD OF THE INVENTION

This invention relates generally to LED alphanumeric displays. Specifically, the invention is directed to a surface-mounted LED alphanumeric display.

BACKGROUND OF THE INVENTION

A desirable encapsulation for a surface mount device is epoxy. Epoxy is well-suited to mass production molding, providing a structurally sound and hermetically-sealed enclosure for the encapsulated components. A surface-mount device is installed by soldering it in place, requiring the application of heat perhaps as high as 200° C. which causes the components of the display to expand. However, if the respective coefficients of thermal expansion (CTE) of the encapsulation, the circuit board, and other components differ markedly, they will expand at proportionately different rates, leading to stress and strain, causing the device to crack and probably fail.

The heat problem for surface mount devices can be dealt with in several ways. First, there is a generally-accepted engineering practice of specifying printed circuit board materials having a low CTE to match the CTE of the copper traces on the circuit board within the device. This will minimize expansion of the circuit board and avoid cracking of the copper traces and other damage to the device. Second, the expansion of the encapsulation can be minimized by employing an opaque epoxy, which has a CTE nearly equal to that of the encapsulated components. The CTE of the epoxy can be further lowered by adding impurities to the epoxy. Thus, when heat is applied, the encapsulation and the components inside will expand at a nearly-equal rate.

For some applications, it would be desirable to provide an LED alphanumeric display in a surface-mount configuration. The active display devices, related logic circuitry, and the interconnecting leads would be placed on a substrate such as a printed circuit board or flex circuit, and the assembly would be encapsulated within a transparent enclosure. Since it is imperative that the encapsulation for a display device be transparent, opaque epoxies and impurities cannot be employed. Nevertheless, it would be desirable to encapsulate the device in epoxy. However, the required clear epoxy has a CTE considerably higher than that of the circuit boards, components, and interconnecting leads of the typical display device. If no provision is made for the high CTE of clear epoxy, the device will likely fail as a result of the heat from soldering.

To avoid failure due to uneven expansion of the various components and the clear epoxy encapsulation of the LED alphanumeric display, the composition of the components and encapsulation should be selected such that the coefficients of thermal expansion (CTE) of those components are equivalent or nearly so.

SUMMARY OF THE INVENTION

The present invention obviates the aforementioned problem by matching or nearly matching the CTE of the circuit board to that of the clear epoxy, contrary to the generally accepted practice of matching the CTE of the epoxy to that of the components within the encapsulation. Advantageously, when heat is applied to the device, the inner components will expand at approximately the same rate as the clear epoxy encapsulation. The lead frame, although having a much lower CTE, makes minimal contact with the encapsulation and therefore essentially floats within the package and should not impose significant stress or strain on the device.

BRIEF DESCRIPTION OF THE DRAWINGS

For a better understanding of the invention, reference is made to the following description of an exemplary embodiment thereof, and to the accompanying drawings, herein.

DETAILED DESCRIPTION

Figure 1:
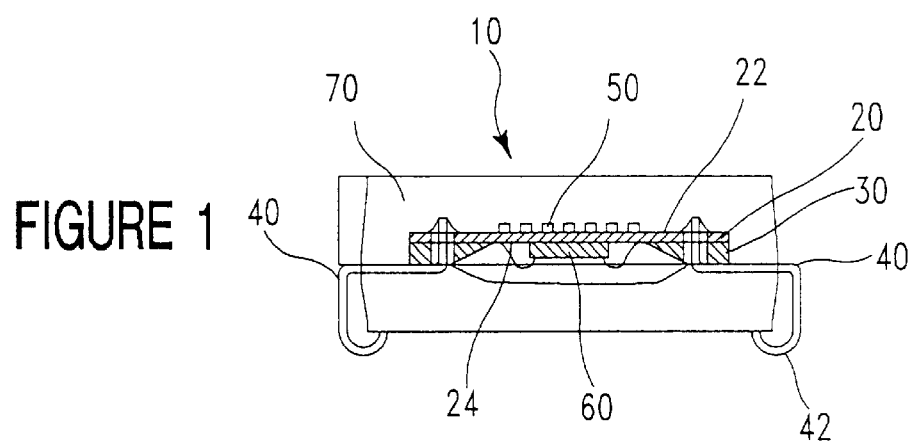
FIG. 1 is an sectional view of a surface-mount LED alphanumeric display having a flex circuit substrate.

FIG. 1 shows a surface-mount LED alphanumeric display device 10 having a compliant, two-layer flex circuit 20. The flex circuit 20 is bonded or otherwise attached to an Ultem stiffener 30. Ultem is a trademark for a General Electric polyetherimide material having a coefficient of thermal expansion (CTE) of approximately $60 \times 10^{-6}$ per °C., selected because it has a CTE approximately equal to that of clear epoxy, although one could choose another material having a nearly-equivalent CTE.

The device 10 has leads 40 for providing power and control to the device 10, two of which are visible in FIG. 1. The leads 40 are provided with J-bends 42, which afford tight vertical stacking and mounting. Display elements 50 are located on the top surface 22 of the flex circuit 20, while a CMOS logic device 60 is located on the under surface 24.

The flex circuit 20, the Ultem stiffener 30, the display elements 50, and the CMOS logic device 60 are enclosed in a clear epoxy encapsulation 70, while the leads 40 are permitted to protrude out from the encapsulation 70.

Figure 2:
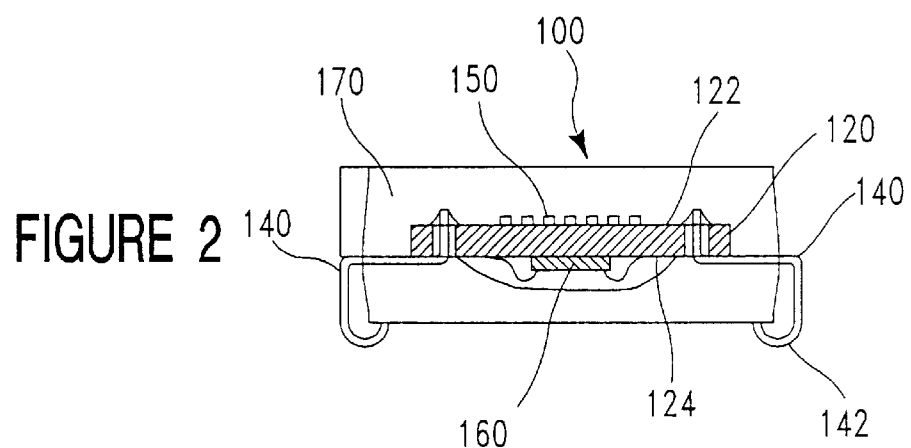
FIG. 2 is an sectional view of a surface-mount LED alphanumeric display having a plastic PCB substrate.

In lieu of a compliant flex circuit, a plastic printed circuit board can be utilized as the substrate as illustrated in FIG. 2. As shown, a surface-mount LED alphanumeric display device 100 has a plastic printed circuit board (PCB) 120 having a CTE of approximately $60 \times 10^{-6}$ per °C. The PCB 120 can be fabricated from Ultem material, which has such a CTE, or any other material having a nearly-equivalent CTE.

The device 100 also has leads 140 with J-bends 142, and display elements 150 and a CMOS logic device 160 mounted on opposite surfaces 122 and 124, respectively, of the PCB 120. As with the device of FIG. 1, the PCB 120 is encased in an epoxy encapsulation 170 with protruding leads 140.

Figure 3:
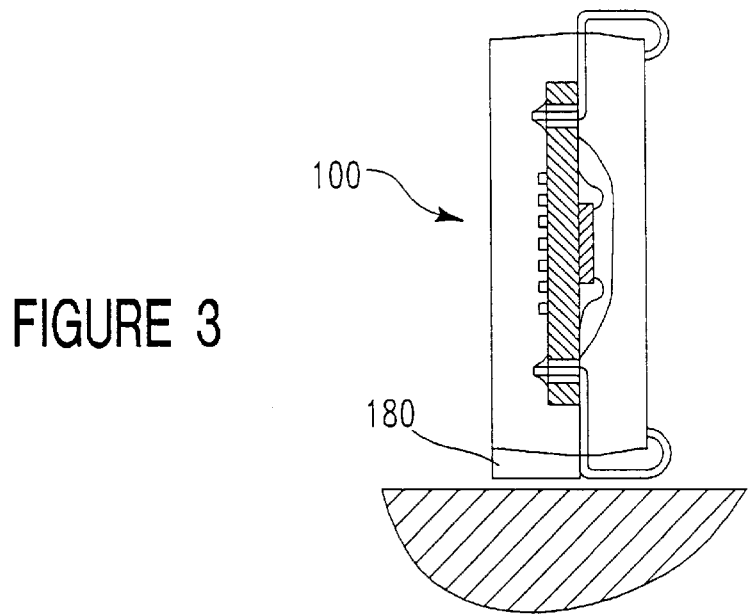
FIG. 3 is an sectional view of a vertically-mounted LED alphanumeric display having a plastic PCB substrate.

The device 100 of FIG. 2 can be mounted vertically as shown in FIG. 3. To maintain the device 100 in a vertical orientation, vertical stabilizers 180 can be provided to create a relatively stable rest on one side of the device. Similarly, the device 10 of FIG. 1 could be positioned vertically.

Figure 4:
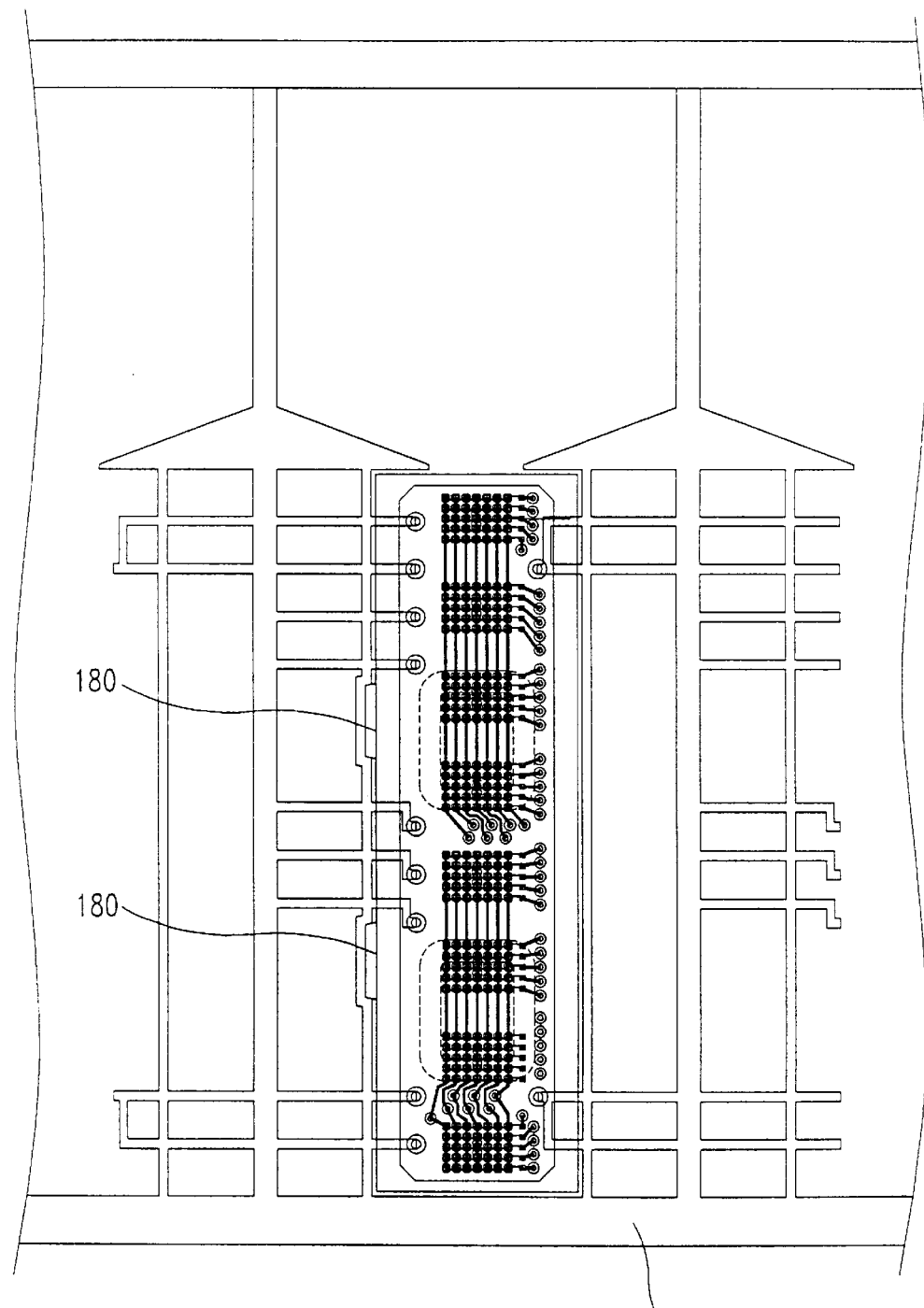
FIG. 4 is a plan view of a surface-mount LED alphanumeric display and leadframes prior to encapsulation.

The device 10 is shown with leadframes 200 in FIG. 4 prior to encapsulation. Visible to one side of the flex circuit 20 are the vertical stabilizers 180.

The device can be encapsulated using the closed mold described in co-pending U.S. patent application Ser. No. 08/579,555, filed Dec. 27, 1995, for a Closed-Mold LED alphanumeric display, assigned to the same assignee as the present application, issued as U.S. Pat. No. 5,855,924 and incorporated herein by reference.

The embodiments described herein are merely illustrative of the principles of the present invention. Various modifications may be made thereto by persons ordinarily skilled in the art, without departing from the scope or spirit of the invention.

What is claimed is:

1. An LED alphanumeric display device, comprising:

a clear epoxy encapsulation, the epoxy having a coefficient of thermal expansion;

a circuit board comprising a flexible circuit affixed to a stiffener and containing at least one display element, the circuit board having a coefficient of thermal expansion approximately equal to the coefficient of thermal expansion of the clear epoxy.

2. The device as set forth in claim 1 wherein the stiffener is plastic.

3. The device as set forth in claim 1 wherein the stiffener is fabricated from polyetherimide material.

4. The device as set forth in claim 1, wherein the circuit board comprises a plastic circuit board.

5. The device as set forth in claim 4 wherein the plastic circuit board is fabricated from polyetherimide material.

6. The device as set forth in claim 1, further comprising leads connected to the circuit board, for providing power and control to the device from at least one external source.

7. An encapsulated LED alphanumeric display device, comprising:

a clear epoxy encapsulation, the epoxy having a coefficient of thermal expansion;

a circuit board containing at least one display element and related logic circuitry, the circuit board being a flexible circuit affixed to a stiffener and the stiffener having a coefficient of thermal expansion approximately equal to the coefficient of thermal expansion of the clear epoxy; and leads connected to the circuit board, for providing power and control to the device from at least one external source.

8. A device as set forth in claim 7 wherein the stiffener is a plastic.

9. An encapsulated LED alphanumeric display device, comprising:

a clear epoxy encapsulation, the epoxy having a coefficient of thermal expansion;

a plastic printed circuit board containing at least one display element and related logic circuitry, the plastic printed circuit board comprising a flexible circuit affixed to a stiffener, the circuit board having a coefficient of thermal expansion approximately equal to the coefficient of thermal expansion of the clear epoxy; and leads connected to the circuit board, for providing power and control to the device from at least one external source.

10. An encapsulated intelligent display device, comprising:

a clear epoxy encapsulation, the epoxy having a coefficient of thermal expansion;

a circuit board containing at least one display element and related logic circuitry, the circuit board being a flexible circuit affixed to a high-temperature thermal-plastic stiffener, the high-temperature thermal-plastic stiffener having a coefficient of thermal expansion approximately equal to the coefficient of thermal expansion of the clear epoxy; and leads connected to the circuit board, for providing power and control to the device.

11. A device as set forth in claim 10 wherein the high-temperature thermal-plastic stiffener is injection moldable.

* * * * *